(12) United States Patent
Jeong et al.

(10) Patent No.: US 9,035,545 B2
(45) Date of Patent: May 19, 2015

(54) ORGANIC LIGHT EMITTING DEVICE COMPRISING ENCAPSULATING STRUCTURE

(75) Inventors: Kwang Jin Jeong, Chungcheongbuk-do (KR); Min Soo Kang, Daejeon (KR); Jong Seok Kim, Seoul (KR); Hyun Jee Yoo, Daejeon (KR); Yoon Gyung Cho, Daejeon (KR)

(73) Assignee: LG CHEM, LTD., Seoul (KR)

( * ) Notice: Subject to any disclaimer, the term of this patent is extended or adjusted under 35 U.S.C. 154(b) by 0 days.

(21) Appl. No.: 13/808,477

(22) PCT Filed: Jul. 7, 2011

(86) PCT No.: PCT/KR2011/004978
§ 371 (c)(1),
(2), (4) Date: Apr. 22, 2013

(87) PCT Pub. No.: WO2012/005526
PCT Pub. Date: Jan. 12, 2012

(65) Prior Publication Data
US 2013/0207093 A1 Aug. 15, 2013

(30) Foreign Application Priority Data

Jul. 7, 2010 (KR) .................. 10-2010-0065440
Jul. 7, 2011 (KR) .................. 10-2011-0067264

(51) Int. Cl.
*H01L 51/54* (2006.01)
*H01J 1/62* (2006.01)
*H01L 51/52* (2006.01)
*H05B 33/04* (2006.01)

(52) U.S. Cl.
CPC ........ *H01L 51/5253* (2013.01); *H01L 51/5243* (2013.01); *H01L 51/5246* (2013.01); *H05B 33/04* (2013.01)

(58) Field of Classification Search
CPC ............ H01L 51/5253; H01L 51/5243; H01L 51/5246; H01L 33/04
USPC ...................... 313/504, 512; 257/40, 99, 100, 257/E33.059, E33.064, E51.026
See application file for complete search history.

(56) References Cited

U.S. PATENT DOCUMENTS

| 7,868,080 | B2 | 1/2011 | Kim et al. | |
| 2006/0178466 | A1 | 8/2006 | Kim et al. | |
| 2008/0265753 | A1* | 10/2008 | Ricks et al. | 313/504 |
| 2009/0179566 | A1* | 7/2009 | Imamura | 313/512 |

(Continued)

FOREIGN PATENT DOCUMENTS

| CN | 101120461 A | 2/2008 |
| JP | 08236271 A | 9/1996 |

(Continued)

*Primary Examiner* — Dao H Nguyen
(74) *Attorney, Agent, or Firm* — McKenna Long & Aldridge LLP

(57) ABSTRACT

Provided is an organic light emitting diode including an organic light-emitting part including a first electrode, an organic material layer having a light-emitting layer, and a second electrode, and an encapsulating layer included on an entire top surface of the organic light-emitting part. Here, the encapsulating layer has a structure in which at least two of a water barrier film, a glass cap, a metal foil and a conductive film are stacked. Accordingly, the diode may have excellent water and oxygen barrier effects, and deterioration of the diode or running failure may be prevented.

26 Claims, 3 Drawing Sheets

(56) References Cited

U.S. PATENT DOCUMENTS

2009/0279285 A1* 11/2009 Nakayama et al. .......... 362/97.3
2010/0253215 A1* 10/2010 Fukagawa et al. ............ 313/504

FOREIGN PATENT DOCUMENTS

| | | |
|---|---|---|
| JP | 2004079292 A | 3/2004 |
| JP | 2006-261057 | 9/2006 |
| JP | 2006236987 A | 9/2006 |
| JP | 2006331695 A | 12/2006 |
| JP | 2008-010211 | 1/2008 |
| JP | 2008-0102011 A | 1/2008 |
| JP | 2008506832 A | 3/2008 |
| JP | 2008514776 A | 5/2008 |
| KR | 1020090015293 | 2/2009 |
| WO | 2006087653 A2 | 8/2006 |
| WO | 2009148722 A2 | 12/2009 |

* cited by examiner

ORGANIC LIGHT EMITTING DEVICE COMPRISING ENCAPSULATING STRUCTURE

This application is a National Stage Entry of International Application No. PCT/KR2011/004978, filed Jul. 7, 2011, and claims the benefit of Korean Application No. 10-2010-0065440 filed on Jul. 7, 2010, and 10-2011-0067264 filed Jul. 7, 2011 all of which are hereby incorporated by reference in their entirety for all purposes as if fully set forth herein.

TECHNICAL FIELD

The present invention relates to an organic light emitting device/diode comprising an organic light-emitting part including a first electrode, an organic material layer having a light-emitting layer and a second electrode, and an encapsulating layer included on the entire top surface of the organic light-emitting part. The encapsulating layer has a structure in which at least two of a water barrier film, a glass cap, a metal foil and a conductive film are stacked.

BACKGROUND ART

An organic light emitting diode (OLED) is a device emitting light by decaying excitons formed by holes and electrons injected into a light-emitting layer through an electrode. Such an OLED has a smaller thickness, lower power consumption, a wider viewing angle and a higher response speed than a conventional liquid crystal display since the OLED has self-emission characteristics. In addition, the OLED can be driven at a lower voltage of 10 V or less and has lower power consumption and better expression of color than a plasma display panel or an inorganic electroluminescence (EL) panel display. Moreover, the OLED may be manufactured using a flexible plastic substrate.

For compatibility of the OLED, the main problems to be solved are durability and electric conductivity. An organic material and a metal electrode included in the OLED may be easily oxidized by water. Accordingly, it is necessary to effectively prevent penetration of oxygen or water into the OLED from outside. In addition, the OLED is very vulnerable to physical impact and degradation in durability due to deterioration of the diode when heat exhaustion is not facilitated.

In the case of a current lighting device using an OLED, an encapsulating technique using an epoxy resin is applied. However, since a large amount of heat is generated while the light is constantly driven, the diode deteriorates due to the generated heat and thus fails while running.

DISCLOSURE

Technical Problem

The present invention is directed to providing an encapsulated structure for face sealing or film encapsulation, which is entirely in contact with a diode to prevent deterioration of the device and failure while running.

Technical Solution

According to an exemplary embodiment of the present invention, an OLED includes an organic light-emitting part including a first electrode, an organic material layer having a light-emitting layer and a second electrode, and an encapsulating layer included on the entire top surface of the organic light-emitting part. The encapsulating layer has a structure in which at least two of a water barrier film, a glass cap, a metal foil and a conductive film are stacked.

Advantageous Effects

An OLED according to the present invention has an encapsulating layer formed of at least two kinds of materials, thereby having excellent water and oxygen barrier effects. The deterioration of the diode and failure while running can be prevented since the encapsulating layer is entirely in contact with the diode.

BEST MODE

Figure 1:
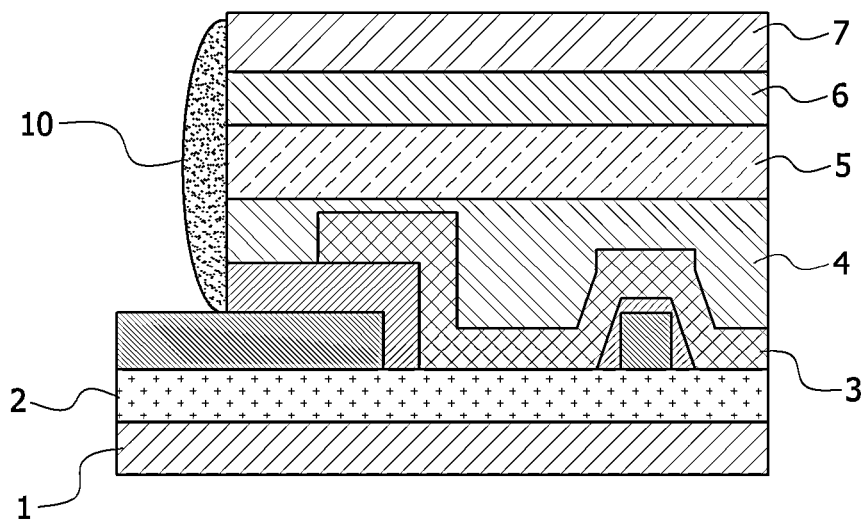
FIGS. 1 to 3 are cross-sectional views of an OLED according to an exemplary embodiment of the present invention.

Hereinafter, the present invention will be described in detail. An OLED according to the present invention includes an organic light-emitting part including a first electrode, an organic material layer having a light-emitting layer and a second electrode, and an encapsulating layer included on the entire top surface of the organic light-emitting part. The encapsulating layer has a structure in which at least two of a water barrier film, a glass cap, a metal foil and a conductive film are stacked.

The OLED according to the present invention has excellent water barrier reliability and an excellent effect of externally exhausting heat generated in the diode. For example, it was observed that the OLED in which the encapsulating layer was formed to a thickness of 3 mm or less had a reliability maintaining period in which no contraction of the device was observed for 180 hours or more under conditions including at a temperature of 85° C. and at a humidity of 85%. In addition, it was observed in a temperature change observing test that the diode did not deteriorate during the 1-hour running condition including at a temperature of 25° C. and at a current density of 15 mA/cm$^2$ or less.

While a thickness of the encapsulating layer used in a test for confirming physical properties of the OLED is in the range of 0.5 to 3 mm, a smaller or larger one than the above range of the thickness is not excluded from the scope of the present invention. In addition, whether or not deterioration of the diode during the 1-hour running at a current density of 5 to 15 mA/cm$^2$ was observed in the temperature change observing test, the current density for running the OLED is not limited to the above range.

The term "water barrier reliability of the diode" or "reliability in which no contraction of the diode was observed" used herein refers to the time at which deformation of an exterior of the diode due to the contraction of the diode under a certain condition is not observed. For example, the reliability may be the result obtained by observing whether the exterior of the diode was or was not changed due to contraction of the diode at a temperature of 85° C. and at a humidity of 85%. A reliability maintaining period may refer to the time to confirm the transformation of the exterior of the diode by an observer, for example, the time to contract a side length of the diode 2.5% or more based on the initial observation time.

The OLED according to the present invention may have a structure including a sealant sealing a side surface of the organic light-emitting part. The side-surface sealant enhances water barrier strength of the encapsulating layer. As the sealant, a UV seal or epoxy resin may be used, but the present invention is not limited thereto. For example, the sealant is included by dispensing a UV-curable epoxy resin to the side surface of the organic light-emitting part and performing UV curing on the epoxy resin.

The encapsulating layer according to the present invention has a structure in which at least two of a water barrier film, a glass cap, a metal foil and a conductive film are stacked. For example, the encapsulating layer includes a structure formed by stacking two, three or four of the above-described elements.

In one exemplary embodiment of the present invention, the encapsulating layer may have a structure in which at least two of a water barrier film, a glass cap, a metal foil and a conductive film are stacked. The encapsulating layer may have a structure in which a water barrier film and a glass cap are stacked, a structure in which a water barrier film and a metal foil are stacked, or a structure in which a conductive film and a metal foil are stacked. Specifically, the structure in which a water barrier film and a glass cap are stacked has relatively excellent water barrier reliability. For example, it was observed that the reliability maintaining period in which no contraction of the diode was observed at a temperature of 85° C. and at a humidity of 85% was 280 hours or more. It was confirmed that the structure in which a water barrier film and a metal foil are stacked has excellent water barrier reliability and thermal conductivity. For example, it was observed that the reliability maintaining period in which no contraction of the diode was observed at a temperature of 85° C. and at a humidity of 85% was 240 hours or more, and the diode did not deteriorate during the 1-hour running at a temperature of 25° C. and at a current density of 17.5 mA/cm² or less.

The water barrier film may be formed of a material containing at least one of clay and a silica filler. A thickness of the water barrier film may be in the range of 5 to 50 μm. When the thickness is less than 5 μm, the water barrier effect may be insignificant, and when the thickness is more than 50 μm, thermal conductivity may be degraded. A water vapor transmission rate of the water barrier film may be $10^{-2}$ g/m² day or less, for example, between $10^{-8}$ and $10^{-2}$ g/m² day.

The glass cap may be formed of at least one of a soda-lime glass and a non-alkali glass. The thickness of the glass cap may be 0.5 to 1.1 mm.

The encapsulating layer may include the water barrier film and/or a metal foil. The material for the metal foil may include at least one selected from stainless (SUS), aluminum (Al) and a nickel alloy (Ni-Alloy). A thickness of the metal foil may be 0.1 to 3 mm. When the thickness of the metal foil is less than 0.1 mm, water and oxygen barrier effects are insignificant, and when the thickness of the metal foil is more than 3 mm, internal thermal conductivity may be degraded. When the metal foil is used, the internal thermal conductivity may be higher than that of the glass material.

The encapsulating layer may include a conductive film and/or the metal foil. As the conductive film, carbon black filler may be used. For example, a thickness of the conductive film may be 5 to 50 μm, and a water vapor transmission rate may be $10^{-8}$ to $10^{-2}$ g/m² day.

In an exemplary embodiment of the present invention, the encapsulating layer may include the metal foil, which may be electrically connected with the second electrode. For example, when the encapsulating layer includes the conductive film and the metal foil, the metal foil may be electrically connected with the second electrode through the conductive film. Particularly, when power is applied to the metal foil, a current may be applied through the conductive film stacked on the metal foil. In another exemplary embodiment of the present invention, the metal foil may be substituted with the second electrode, and in this case, a separate second electrode is not necessarily included, and thus the structure of the diode and the manufacturing process become simpler.

The encapsulating layer of the present invention may further include a buffer layer. The encapsulating layer may further include a separate buffer layer. For example, the buffer layer may be formed between the second electrode and the encapsulating layer. When the buffer layer is formed, an adhesive strength between the second layer and the encapsulating layer is enhanced, a crack in the encapsulating layer is prevented, and thus the life span of the encapsulating layer may be increased. In addition, due to a phenomenon of pressing the diode during assembly of the film encapsulating layer, a short may occur in the OLED. Here, when the buffer layer is used suitably, stability of the OLED may be increased. A thickness of the buffer layer of the encapsulating layer may be 100 to 3000 Å. The buffer layer may be formed of an organic or organic-inorganic composite.

In an organic material, a material of Formula 1 and a derivative thereof may be included, but the present invention is not limited thereto.

[Formula 1]

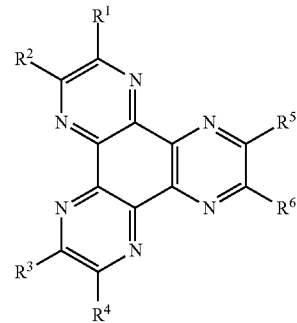

In Formula 1, $R_1$ to $R_6$ are independently selected from the group consisting of hydrogen, a halogen atom, nitrile (—CN), nitro (—NO₂), sulfonyl (—SO₂R), sulfoxide (—SOR), sulfonamide (—SO₂NR), sulfonate (—SO₃R), trifluoromethyl (—CF₃), ester (—COOR), amide (—CONHR or —CONRR'), substituted or unsubstituted linear or branched $C_1$-$C_{12}$ alkoxy, substituted or unsubstituted linear or branched $C_1$-$C_{12}$ alkyl, a substituted or unsubstituted aromatic or non-aromatic hetero ring, substituted or unsubstituted aryl, substituted or unsubstituted mono- or di-arylamine, and substituted or unsubstituted aralkylamine, and R and R' are independently selected from the group consisting of a substituted or unsubstituted $C_1$-$C_{60}$ alkyl, a substituted or unsubstituted aryl and a substituted or unsubstituted 5-7-membered hetero ring.

Another example of the buffer layer may be formed by mixing an organic silane and an epoxy resin. The kind of organic silane is not particularly limited, and the organic silane may be selected from the group consisting of methyltrimethoxysilane, methyltriethoxysilane, phenyltrimethoxysilane, phenyltriethoxysilane, dimethyldimethoxysilane, dimethyldiethoxysilane, diphenyldimethoxysilane, diphenyldiethoxysilane, phenyldimethoxysilane, phenyldiethoxysilane, methyldimethoxysilane, methyldiethoxysilane, phenylmethyldimethoxysilane, phenylmethyldiethoxysilane, trimethylmethoxysilane, trimethylethoxysilane, triphenylmethoxysilane, triphenylethoxysilane, phenyldimethylmethoxysilane, phenyldimethylethoxysilane, diphenylmethylmethoxysilane, diphenylmethylethoxysilane, dimethylmethoxysilane, dimethylethoxysilane, diphenylmethoxysilane, diphenylethoxysilane, 3-aminopropyltriethoxysilane, 3-glycidoxypropyltrimethoxysilane, p-aminophenylsilane, allyltrimethoxysilane, n-(2-aminoethyl)-3-aminopropyltrimethoxysilane, 3-aminopropyltriethoxysilane, 3-aminopropyltrimethoxysilane, 3-glycidoxypropyldiisopropylethoxysilane, (3-glycidoxypropyl)methyldiethoxysilane, 3-glycidoxypropyltrimethoxysilane, 3-mercaptopropyltrimethoxysilane, 3-mercaptopropyltriethoxysilane, 3-methacryloxypropylmethyldiethoxysilane, 3-methacryloxypropylmethyldimethoxysilane, 3-methacryloxypropyltrimethoxysilane, n-phenylaminopropyltrimethoxysilane, vinylmethyldiethoxysilane, vinyltriethoxysilane, vinyltrimethoxysilane and a mixture thereof. An example of the epoxy resin is not particularly limited, and may be a UV-curable resin.

A method of applying the encapsulating layer according to the present invention to the diode may include, but is not particularly limited to, removing a protective film of a film patterned on the glass cap or metal foil, aligning the resulting film with a deposition substrate to assemble using a vacuum-thermal assembly system, and curing the film in a thermal treatment oven.

In addition, in the OLED according to the present invention, the deterioration of the diode and the failure while running may be prevented as the encapsulating layer is entirely in contact with the diode. The OLED may be applied in various fields such as a display or light. Particularly, the OLED has an excellent effect of exhausting heat generated inside, and may be more useful as a diode for a light.

MODE FOR INVENTION

The present invention will be described in further detail with reference to the following drawings.

FIG. 1 is a cross-sectional view of an OLED according to an exemplary embodiment of the present invention. Referring to FIG. 1, the OLED according to the present invention includes an organic light-emitting part formed by sequentially stacking a first electrode 2, an organic material layer 3 including a light-emitting layer and a second electrode 4 on a substrate 1, and an encapsulating layer encapsulating the organic light-emitting part. The encapsulating layer sequentially includes a buffer layer 5, a water barrier film 6 and a glass cap 7, and is included on the entire top surface of the organic light-emitting part. In addition, a sealant 10 sealing a side surface of the organic light-emitting part is applied.

Figure 2:
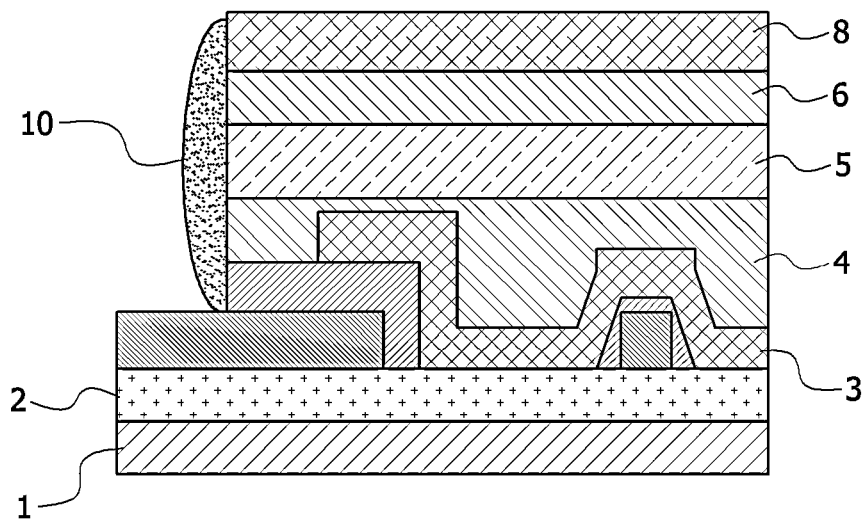

FIG. 2 shows a structure formed by sequentially stacking a buffer layer 5, a water barrier film 6 and a metal foil 8 on an organic light-emitting part according to another exemplary embodiment of the present invention.

Figure 3:
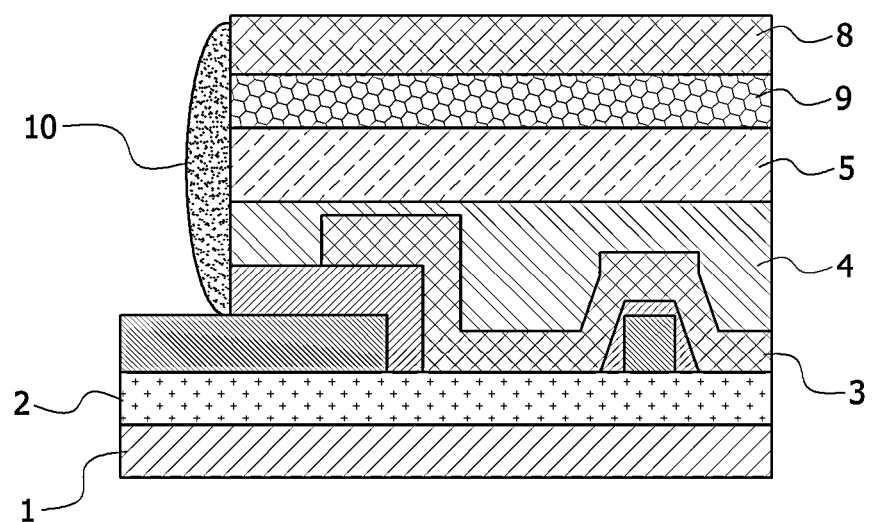

In addition, FIG. 3 shows a structure formed by sequentially stacking a conductive film 9 and a metal foil 8 on an organic light-emitting part according to still another exemplary embodiment of the present invention. The metal foil 8 may be electrically connected with a second electrode 4 through the conductive film 9.

Hereinafter, the present invention will be described in further detail with reference to examples. Examples of the present invention are merely provided for the detailed description of the present invention, not to limit the claims of the present invention.

Example 1

A 2-stack white OLED including a light-emitting region having an area of 50×50 mm$^2$ was manufactured by sequentially forming a first electrode (ITO) to a second electrode (Al), listed in the following table, on a substrate. The substrate used herein does not have a separate auxiliary electrode. Materials for HIL, HTL, EML, ETL, CGL, HBL and EIL were those conventionally used in the field of manufacturing a white OLED, and the manufacturing method was also generally known in the art.

A 20 μm-thick water barrier film containing clay and having a water vapor transmission rate of approximately $1 \times 10^{-2}$ g/m$^2$ day was formed on the entire surface of the second electrode (Al). A soda-lime glass was formed to a thickness of 0.8 mm on the formed water barrier film. Afterward, side surfaces of the OLED device, the water barrier film and the soda-lime glass, which were formed on the substrate, were sealed using an epoxy resin.

Example 2

An OLED was manufactured as described in Example 1, except that a metal foil was formed of 2 mm-thick aluminum instead of the soda-lime glass.

Example 3

An OLED was manufactured as described in Example 1, except that a conductive film including carbon black filler was formed to a thickness of 20 μm instead of the water barrier film, and a metal foil was formed of 2 mm-thick aluminum instead of the soda-lime glass.

Example 4

An OLED was manufactured as described in Example 1, except that a buffer layer was formed between a second electrode (Al) and a water barrier film. The buffer layer was formed to a thickness of 1000 Å using a compound of Formula 1 (HAT).

Comparative Example 1

An OLED was manufactured as described in Example 1, except that a water barrier film was not formed on the entire surface of a second electrode (Al) and a soda-lime glass was formed to a thickness of 3 mm.

Comparative Example 2

An OLED was manufactured as described in Example 1, except that a water barrier film was formed to a thickness of 100 μm on the entire surface of a second electrode (Al), but a separate soda-lime glass was not formed.

Comparative Example 3

An OLED was manufactured as described in Example 1, except that a metal foil was formed of 3 mm-thick aluminum on the entire surface of a second electrode (Al), but a separate water barrier film and soda-lime glass were not formed.

Experimental Example 1

Test of Measuring Water Vapor Transmission Rate

A high temperature and high humidity test was performed on diodes manufactured in the examples and the Comparative Examples using constant temperature and constant humidity equipment to compare water vapor transmission rates. A bezel gap (a distance between an end of an encapsulated part and a light-emitting part) between the diodes was 7 mm, a reliability time was measured by comparing a degree to which a diode contracted in a light-emitting region according to time, which was observed using a microscope, under the test conditions including at a temperature of 85° C. and at a humidity of 85%. The results of the reliability test with respect to respective diodes are shown in Table 1.

TABLE 1

|  | Example 1 | Example 2 | Example 3 | Example 4 | Comparative Example 1 | Comparative Example 2 | Comparative Example 3 |
|---|---|---|---|---|---|---|---|
| Reliability Time | >260 hr | >240 hr | >180 hr | >280 hr | >240 hr | >160 hr | >60 hr |

As shown in Table 1, when the encapsulating layer included the water barrier film (Examples 1, 2 and 4), the reliability was shown at 240 hrs or more. It was confirmed that these cases had characteristics the same as or better than those of Comparative Example 1, which was an encapsulating method generally used using the soda-lime glass encapsulating layer and a UV-epoxy seal.

It was also confirmed that Example 3 using the encapsulating layer formed of the aluminum film and the conductive film had considerably higher reliability than Comparative Example 3 using the encapsulating layer formed of aluminum alone.

Figure 4:
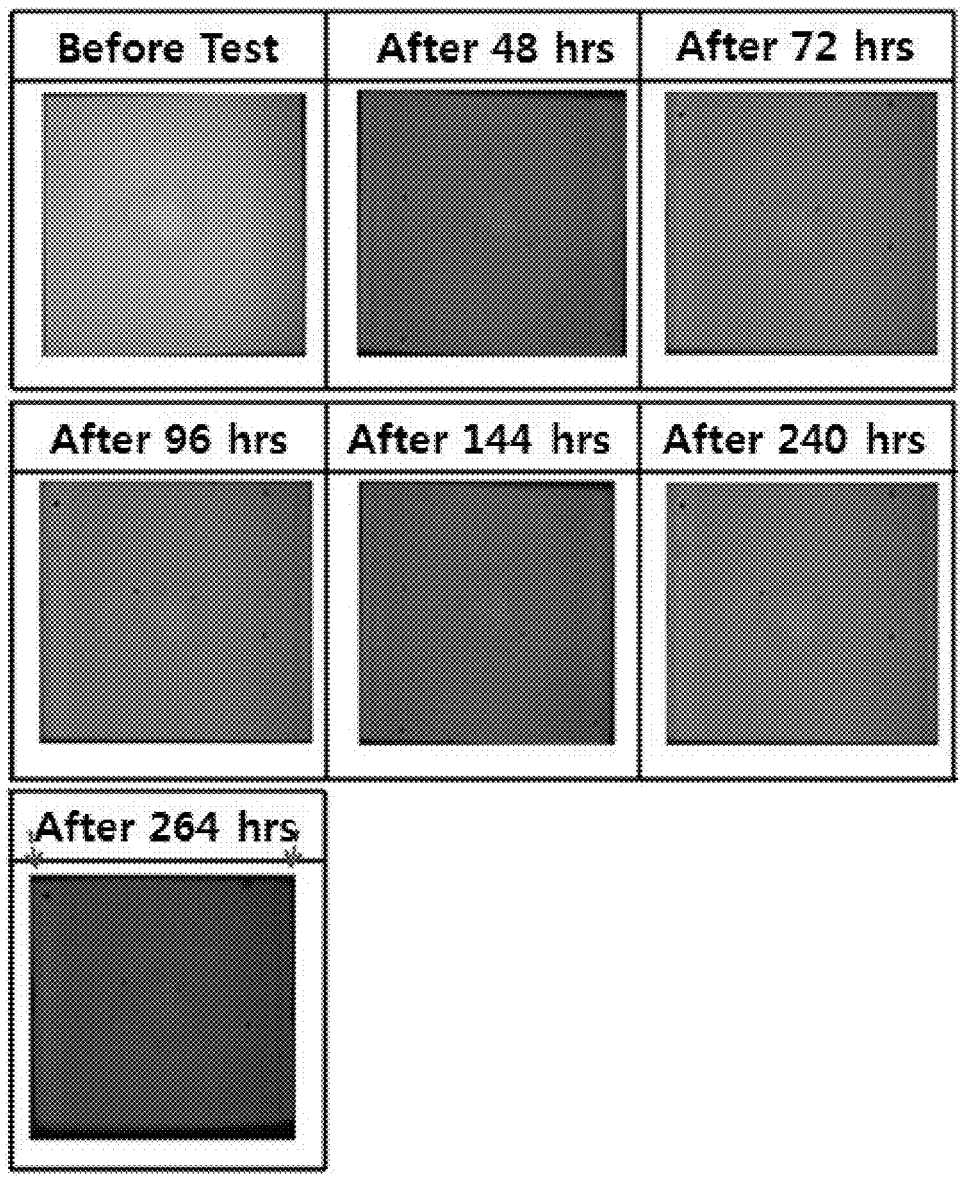
FIG. 4 shows images obtained by observing a time-based process of a water vapor transmission rate test for the OLED according to an exemplary embodiment of the present invention.

FIG. 4 shows images of light-emitting regions using a microscope to measure reliabilities according to time with respect to an example using an aluminum thin film and a water barrier film (Example 2). Referring to FIG. 4, contraction was observed in a light-emitting region 240 hours after the test. Particularly, it was confirmed that transformation occurred due to contraction of edges (denoted by arrows) of the light-emitting region 264 hours after the test. Accordingly, it can be confirmed that Example 2 shows a reliability of 240 hours or more at a temperature of 85° C. and at a humidity of 85%.

Experimental Example 2

Test of Measuring Temperature Change of Diode

A test was performed to confirm degrees of heat generation of the diodes manufactured in Examples 1 to 4 and Comparative Examples 1 to 3. Particularly, after a diode was running at room temperature (25° C.) for 1 hour, a surface temperature of the diode was measured using an IR camera. The surface temperature of the diode was measured with various current densities. The results are shown in Table 2.

The temperature of the diode manufactured in Comparative Example 1 was most sharply increased as the intensity of applied current density was increased, and when the current density of 15 mA/cm$^2$ was applied, the failure of the diode due to deterioration was shown. The diode formed using an aluminum foil has a relatively smaller temperature increase with respect to the applied current density, and thus the failure of the diode was not shown. Particularly, the smallest temperature increase was shown in Example 3 using the conductive film and the metal foil. This is because the stability of the diode was increased as heat generated in the diode was effectively exhausted to an encapsulated part due to a high thermal conductivity of the metal foil when the metal foil was used as an encapsulating material.

INDUSTRIAL APPLICABILITY

The OLED according to the present invention may be widely used in the field of lights or displays.

While the invention has been shown and described with reference to certain exemplary embodiments thereof, it will be understood by those skilled in the art that various changes in form and details may be made therein without departing from the scope of the invention as defined by the appended claims.

The invention claimed is:

1. An organic light emitting diode (OLED), comprising:
   an organic light-emitting part including a first electrode, an organic material layer having a light-emitting layer and a second electrode;
   an encapsulating layer on an entire top surface of the organic light-emitting part, the encapsulating layer having a structure in which a water barrier film and a glass cap are stacked; and
   a buffer layer formed between the second electrode and the encapsulating layer and comprising a material of Formula 1 or a derivative thereof,
   wherein the organic light emitting diode comprising the encapsulating layer having a thickness of 3 mm or less has a reliability maintaining period in which no contraction of the diode is observed at a temperature of 85° C. and a humidity of 85% of 180 hours or more:

TABLE 2

| Current Density | Example 1 | Example 2 | Example 3 | Example 4 | Comparative Example 1 | Comparative Example 2 | Comparative Example 3 |
|---|---|---|---|---|---|---|---|
| 5 mA/cm$^2$ | 37° C. | 36° C. | 35° C. | 37° C. | 37° C. | 37° C. | 35° C. |
| 10 mA/cm$^2$ | 47° C. | 41° C. | 39° C. | 47° C. | 49° C. | 47° C. | 39° C. |
| 12.5 mA/cm$^2$ | 50° C. | 43° C. | 42° C. | 50° C. | 52° C. | 51° C. | 42° C. |
| 15 mA/cm$^2$ | 53° C. | 48° C. | 45° C. | 53° C. | fail | 54° C. | 46° C. |
| 17.5 mA/cm$^2$ | fail | 52° C. | 48° C. | fail | fail | fail | 49° C. |

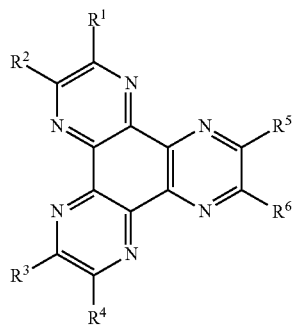

[Formula 1]

wherein in Formula 1, $R_1$ to $R_6$ are independently selected from the group consisting of hydrogen, a halogen atom, nitrile (—CN), nitro (—NO$_2$), sulfonyl (—SO$_2$R), sulfoxide (—SOR), sulfonamide (—SO$_2$NR), sulfonate (—SO$_3$R), trifluoromethyl (—CF$_3$), ester (—COOR), amide (—CONHR or —CONRR'), substituted or unsubstituted linear or branched $C_1$-$C_{12}$ alkoxy, substituted or unsubstituted linear or branched $C_1$-$C_{12}$ alkyl, a substituted or unsubstituted aromatic or non-aromatic hetero ring, substituted or unsubstituted aryl, substituted or unsubstituted mono- or di-arylamine, and substituted or unsubstituted aralkylamine, and R and R' are independently selected from the group consisting of a substituted or unsubstituted $C_1$-$C_{60}$ alkyl, a substituted or unsubstituted aryl and a substituted or unsubstituted 5-7-membered hetero ring.

2. The OLED according to claim 1, further comprising:
a sealant included on a side surface of the organic light-emitting part.

3. The OLED according to claim 1, wherein the water barrier film has a structure containing at least one of clay and a silica filler.

4. The OLED according to claim 1, wherein the water barrier film has a thickness of 5 to 50 μm.

5. The OLED according to claim 1, wherein the water barrier film has a water vapor transmission rate of $10^{-8}$ to $10^{-2}$ g/m$^2$ day.

6. The OLED according to claim 1, wherein the glass cap includes at least one of a soda-lime glass and a non-alkali glass.

7. The OLED according to claim 1, wherein the OLED is a diode for a light.

8. An organic light emitting diode (OLED), comprising:
an organic light-emitting part including a first electrode, an organic material layer having a light-emitting layer and a second electrode; and
an encapsulating layer which is included on an entire top surface of the organic light-emitting part, and which has a structure in which a conductive film comprising carbon black filler and a metal foil are stacked.

9. The OLED according to claim 8, wherein the OLED including the encapsulating layer having a thickness of 3 mm or less has a reliability maintaining period in which no contraction of the diode is observed at a temperature of 85° C. and a humidity of 85% of 180 hours or more, or the diode does not deteriorate during the 1-hour running at a temperature of 25° C. and a at current density of 15 mA/cm$^2$.

10. The OLED according to claim 8, further comprising:
a sealant included on a side surface of the organic light-emitting part.

11. The OLED according to claim 8, wherein the metal foil includes at least one of stainless, aluminum and a nickel-alloy.

12. The OLED according to claim 8, wherein the metal foil has a thickness of 0.1 to 3 mm.

13. The OLED according to claim 8, wherein the conductive film has a thickness of 5 to 50 μm.

14. The OLED according to claim 8, wherein the conductive film has a water vapor transmission rate of $10^{-8}$ to $10^{-2}$ g/m$^2$ day.

15. The OLED according to claim 8, wherein the metal foil is electrically connected with the second electrode through the conductive film.

16. The OLED according to claim 8, wherein the OLED is a diode for a light.

17. An organic light emitting diode (OLED), comprising:
an organic light-emitting part including a first electrode, an organic material layer having a light-emitting layer and a second electrode;
an encapsulating layer which is included on the entire top surface of the organic light-emitting part, and which has a structure in which a water barrier film and a metal foil are stacked; and
a buffer layer formed between the second electrode and the encapsulating layer,
wherein the diode does not deteriorate during the 1-hour running at a temperature of 25° C. and at a current density of 15 mA/cm$^2$.

18. The OLED according to claim 17, wherein the OLED including the encapsulating layer having a thickness of 3 mm or less has a reliability maintaining period in which no contraction of the diode is observed at a temperature of 85° C. and a humidity of 85% of 180 hours or more.

19. The OLED according to claim 17, wherein the OLED including the encapsulating layer having a thickness of 3 mm or less has a reliability maintaining period in which no contraction of the diode is observed at a temperature of 85° C. and a humidity of 85% of 180 hours or more.

20. The OLED according to claim 17, further comprising:
a sealant included on a side surface of the organic light-emitting part.

21. The OLED according to claim 17, wherein the water barrier film has a structure containing at least one of clay and a silica filler.

22. The OLED according to claim 17, wherein the water barrier film has a thickness of 5 to 50 μm.

23. The OLED according to claim 17, wherein the water barrier film has a water vapor transmission rate of $10^{-8}$ to $10^{-2}$ g/m$^2$ day.

24. The OLED according to claim 17, wherein the metal foil includes at least one of stainless, aluminum and a nickel-alloy.

25. The OLED according to claim 17, wherein the metal foil has a thickness of 0.1 to 3 mm.

26. The OLED according to claim 17, wherein the OLED is a diode for a light.

* * * * *